(12) United States Patent
Jayapal et al.

(10) Patent No.: US 11,640,834 B2
(45) Date of Patent: May 2, 2023

(54) VOLTAGE DROOP REDUCTION WITH A SECONDARY POWER SUPPLY

(71) Applicant: MediaTek Singapore Pte. Ltd., Singapore (SG)

(72) Inventors: Senthilkumar Jayapal, Singapore (SG); Yang Bai, Singapore (SG); Chaoqun Liu, Singapore (SG); Yipin Wu, Singapore (SG); Chih-Hung Tai, Hsinchu (TW)

(73) Assignee: MediaTek Singapore Pte. Ltd., Singapore (SG)

( * ) Notice: Subject to any disclaimer, the term of this patent is extended or adjusted under 35 U.S.C. 154(b) by 131 days.

(21) Appl. No.: 17/079,462

(22) Filed: Oct. 24, 2020

(65) Prior Publication Data

US 2022/0130432 A1    Apr. 28, 2022

(51) Int. Cl.
*G11C 5/14*     (2006.01)
*G05F 1/56*     (2006.01)
*H03K 5/01*     (2006.01)

(52) U.S. Cl.
CPC ............ *G11C 5/147* (2013.01); *G05F 1/56* (2013.01); *H03K 5/01* (2013.01)

(58) Field of Classification Search
CPC ............ G11C 5/147; G05F 1/56; H03K 5/01
USPC ........................................................ 365/226
See application file for complete search history.

(56) References Cited

U.S. PATENT DOCUMENTS

| | | | | |
|---|---|---|---|---|
| 7,225,349 B2 * | 5/2007 | Tam | .................. | G06F 1/04 |
| | | | | 713/340 |
| 7,409,568 B2 * | 8/2008 | Tam | .................. | G06F 1/305 |
| | | | | 713/340 |
| 8,710,913 B2 * | 4/2014 | Baumann | ......... | H03K 19/00384 |
| | | | | 327/540 |
| 9,244,515 B2 * | 1/2016 | Kawasaki | ............ | G06F 1/3203 |
| 9,734,904 B1 * | 8/2017 | Cho | .................. | G11C 13/0069 |
| 9,785,222 B2 | 10/2017 | Doyle et al. | | |
| 9,851,730 B2 * | 12/2017 | Patil | .................. | G06F 1/26 |
| 9,946,278 B2 * | 4/2018 | Rodriguez | ............... | G05F 1/56 |
| 10,013,010 B1 | 7/2018 | Ock et al. | | |
| 10,033,355 B2 * | 7/2018 | Tsukamoto | ........ | H03K 19/0016 |
| 10,108,211 B2 * | 10/2018 | Ham | .................... | G05F 1/618 |

(Continued)

OTHER PUBLICATIONS

Kanno et al., "Dynamic Voltage Boost (DVB) Method for Improving Power Integrity of Low-Power Multi-Processor SoCs" 2008 Symposium on VLSI Circuits Digest of Technical Papers, pp. 148-149.

(Continued)

*Primary Examiner* — Ryan Jager
(74) *Attorney, Agent, or Firm* — Tong J. Lee

(57) ABSTRACT

A droop reduction circuit on a die includes a voltage detector circuit to detect voltage droop in a supply voltage received by a first load. The droop reduction circuit further includes a driver controller circuit to drive power switch (PSH) banks in response to detection of the voltage droop. Each of the PSH banks includes at least one power switch having an input terminal, a gate terminal, and an output terminal. The input terminal is to receive a secondary voltage, which is higher than the supply voltage and is also received by a second load on the die. The gate terminal is to receive a drive signal from the driver controller, and the output terminal is to pull up the voltage droop in the supply voltage.

17 Claims, 6 Drawing Sheets

(56) References Cited

U.S. PATENT DOCUMENTS

| | | | |
|---|---|---|---|
| 10,108,212 B2* | 10/2018 | Park | G05F 1/59 |
| 10,108,213 B2* | 10/2018 | Yang | G05F 1/575 |
| 10,218,273 B2* | 2/2019 | Ergin | G05F 1/56 |
| 10,248,177 B2* | 4/2019 | Rodriguez | G06F 1/3243 |
| 10,326,361 B2* | 6/2019 | Kung | G05F 1/575 |
| 10,483,961 B2* | 11/2019 | Bang | H03K 17/161 |
| 10,649,479 B2* | 5/2020 | Heo | G05F 1/59 |
| 10,684,671 B2* | 6/2020 | Sridhar | G06F 1/3296 |
| 11,036,253 B1* | 6/2021 | Paternoster | H03L 7/0995 |
| 11,157,028 B1* | 10/2021 | Lundberg | G05F 1/575 |
| 11,249,530 B1* | 2/2022 | Pal | G06F 1/26 |
| 11,264,976 B2* | 3/2022 | Hamdan | H03L 7/081 |
| 2004/0021503 A1 | 2/2004 | Hulfachor | |
| 2014/0070878 A1* | 3/2014 | Kawasaki | G06F 1/263 |
| | | | 327/543 |
| 2014/0223205 A1* | 8/2014 | Muthukaruppan | G06F 1/32 |
| | | | 713/320 |
| 2014/0277812 A1* | 9/2014 | Shih | G05F 1/46 |
| | | | 700/297 |
| 2016/0179181 A1* | 6/2016 | Doyle | G05F 1/575 |
| | | | 713/323 |
| 2016/0246342 A1* | 8/2016 | Muthukaruppan | G05F 1/59 |
| 2016/0282889 A1* | 9/2016 | Mahajan | G05F 1/575 |
| 2017/0244949 A1 | 8/2017 | Peterson | |
| 2018/0011866 A1 | 1/2018 | Bowman et al. | |
| 2018/0374853 A1 | 1/2018 | Ergin | |
| 2018/0046209 A1* | 2/2018 | Patil | G05F 1/10 |
| 2020/0089299 A1* | 3/2020 | Kim | H03L 7/097 |
| 2020/0272220 A1* | 8/2020 | Mosalikanti | H03L 7/093 |
| 2021/0190835 A1* | 6/2021 | Felix | G06F 1/28 |
| 2021/0191488 A1* | 6/2021 | Felix | H03K 19/00369 |
| 2021/0240142 A1* | 8/2021 | Bang | G05B 11/42 |
| 2021/0399722 A1* | 12/2021 | Hamdan | H03L 7/081 |

OTHER PUBLICATIONS

The European Search Report on Application No. EP21188084, dated Jan. 20, 2022.

* cited by examiner

US 11,640,834 B2

VOLTAGE DROOP REDUCTION WITH A SECONDARY POWER SUPPLY

TECHNICAL FIELD

The invention relates to an electronic circuit that manages power supplied to a load.

BACKGROUND

With the process technology continuing to reduce in size, transistors on a die operate with lower voltage and higher current density. The increase in processing speed and current charge means that the rate of change in current (i.e., di/dt) may increase significantly during some point of operation. For example, a circuit (i.e., a load) can draw a large current when it wakes up, which causes the supply voltage to drop. The drop in the supply voltage, which is called voltage droop, causes performance loss.

Power integrity in the context of circuit design aims to ensure that the required voltage and current are met from the source to the destination. Power integrity can be a determining factor in the success or failure of an electronic product. One of the issues in power integrity is the delivery of a stable voltage to a load on a die, such as a processor. Power integrity can be improved by reducing voltage droop in the supply voltage provided to a load.

SUMMARY

In one embodiment, a droop reduction circuit is provided on a die. The droop reduction circuit includes a voltage detector circuit to detect voltage droop in a supply voltage received by a first load, and a driver controller circuit to drive power switch (PSH) banks in response to detection of the voltage droop. Each of the PSH banks includes at least one power switch having an input terminal, a gate terminal, and an output terminal. The input terminal is to receive a secondary voltage which is higher than the supply voltage and is received by a second load on the die. The gate terminal is to receive a drive signal from the driver controller, and the output terminal is to pull up the voltage droop in the supply voltage.

In another embodiment, a method of a droop reduction circuit on a die is provided. The method comprises: detecting the voltage droop in a supply voltage received by a first load; generating drive signals to turn on PSH banks in response to detection of the voltage droop; and pulling up the voltage droop by power switches in the PSH banks. Each power switch has an input terminal to receive a secondary voltage and a gate terminal to receive one of the drive signals. The secondary voltage is higher than the supply voltage and is received by a second load on the die.

Other aspects and features will become apparent to those ordinarily skilled in the art upon review of the following description of specific embodiments in conjunction with the accompanying figures.

BRIEF DESCRIPTION OF THE DRAWINGS

The invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention provide a droop reduction circuit to reduce voltage droop in the supply voltage received by a first load. The droop reduction circuit receives a secondary voltage to pull up the droop in the supply voltage. The secondary voltage is higher than the supply voltage and is also supplied to a second load on the same die as the droop reduction circuit. In one embodiment, the first load may be a processor and the second load may be a memory cell array. In an alternative embodiment, the first load may be a core logic circuit and the second load may be another on-die circuit.

In one embodiment, the droop reduction circuit and the first load may be located on the same die for high efficiency. Alternatively, the droop reduction circuit and the first load may be located on different dices. The droop reduction circuit and the first load may operate at the same clock rate or different clock rates. In one embodiment, the droop reduction circuit, the first load, and the second may be part of a system-on-a-chip (SOC) device, such as a processing and/or communication device with embedded memory. The droop reduction circuit improves the power integrity of the device, and, therefore, improves the overall performance of the device.

In the following description, the terms "connect," "couple" and their derivatives, are used to indicate that two or more elements, which may or may not be in direct physical contact, have an electrical connection between or among them. Thus, the terms "connected" and "coupled"

hereinafter are used equivalently to "electrically connected" and "electrically coupled," respectively.

Figure 1A:
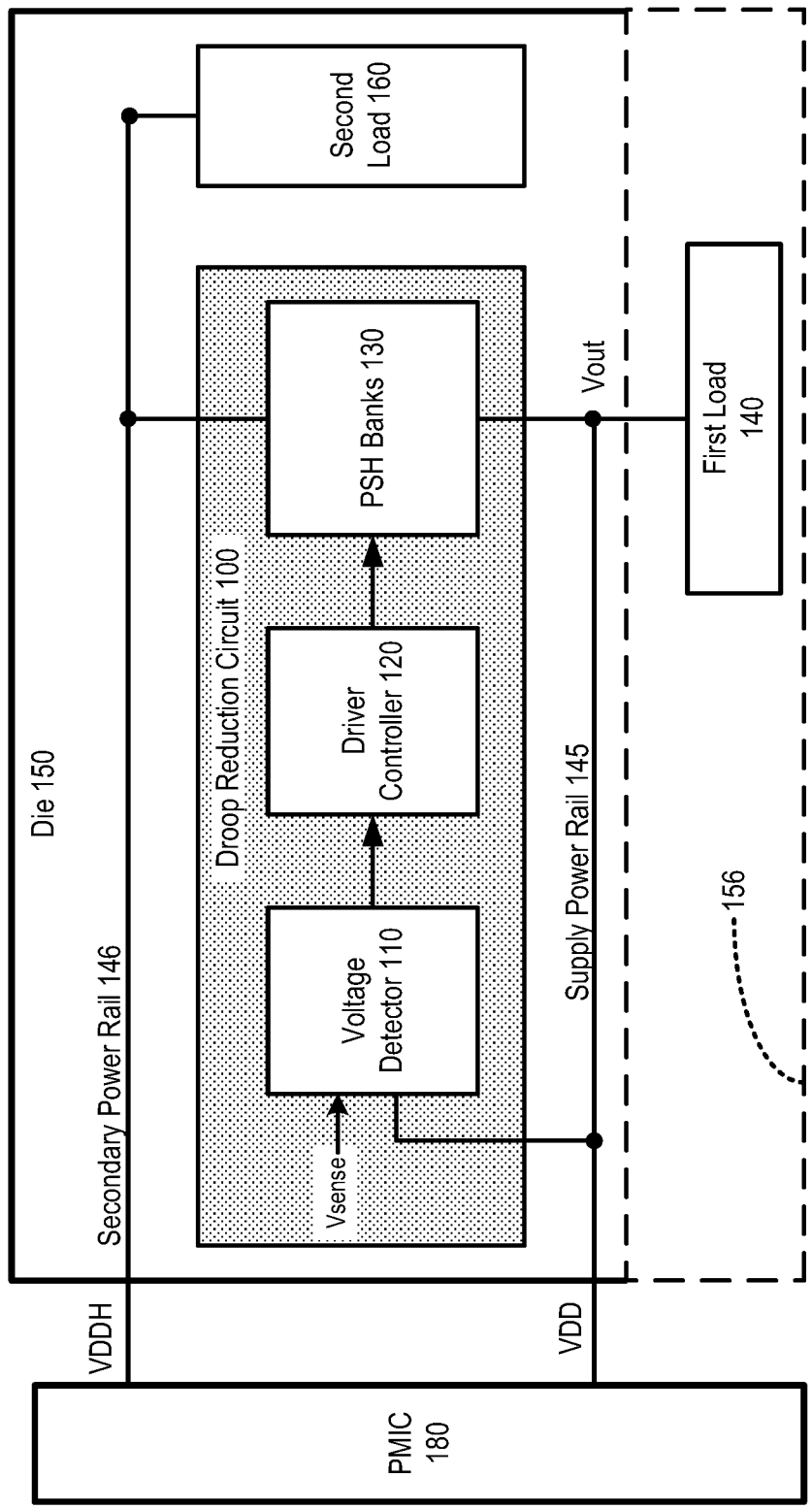
FIG. 1A illustrates a droop reduction circuit according to one embodiment.

FIG. 1A illustrates a droop reduction circuit 100 according to one embodiment. The droop reduction circuit 100 includes a voltage detector 110, a driver controller 120, and power switch (PSH) banks 130. The droop reduction circuit 100 reduces the voltage droop in a supply voltage, which has a nominal value VDD. For example, VDD=0.75 volts (V). The supply voltage is supplied from a supply power rail 145 to a first load 140, which may be located on the same die 150 and may operate at the same clock rate as the droop reduction circuit 100. Alternatively, the first load 140 may be located on a different die. In FIG. 1A, the location of the first load 140 is represented by a dotted block 156 to indicate that the first load 140 may be located on the die 150 or on another die. The first load 140 is designed to operate with the supply voltage at VDD. In some scenarios, the first load 140 may draw an increased current from the supply power rail 145, causing a voltage droop in the supply voltage. For example, the amount of current drawn by the first load 140 may sharply increase when the first load is powered on. The voltage droop has a negative impact on the power efficiency and performance of the first load 140. In some embodiments, the first load 140 may be a processing core, a central processing unit (CPU), a graphic processing unit (GPU), a digital signal processor (DSP), an accelerated processing unit (APU), a media processor, an image processor, an arithmetic logic unit (ALU), or other general-purpose or special-purpose processing or logic circuitry.

In one embodiment, the voltage detector 110 includes a comparator which compares the supply voltage with a reference voltage (Vsense). Vsense may be configured to be lower than the nominal value VDD by a predetermined amount or percentage. The voltage detector 110 generates a detection signal when it detects the supply voltage to be lower than Vsense. Upon receiving the detection signal, the driver controller 120 generates a set of drive signals to turn on one or more of the PSH banks 130. Each PSH bank 130 may be independently turned on or off by a corresponding drive signal.

The PSH banks 130 include multiple banks (i.e., groups) of power switches. The input terminal of each power switch is coupled to a secondary power rail 146 to receive a secondary voltage at VDDH, where VDDH is greater than VDD. For example, VDDH=VDD+ΔV millivolts (mV), where ΔV may be in the range of 150 to 200 mV. Thus, in an embodiment where VDD=0.75V, VDDH is less than 1V. The output terminal of each power switch is coupled to the supply power rail 145, which provides the supply voltage to the first load 140. When a power switch is turned on, the output terminal of the power switch pulls up (i.e., reduces) the voltage droop in the supply voltage, thereby stabilizing the voltage supplied to the first load 140. When the current drawn by the first load 140 reaches a steady-state, the power switch may be turned off in a staggered manner to prevent voltage overshoot.

In one embodiment, the droop reduction circuit 100 is an integrated circuit on the die 150. In one embodiment, the droop reduction circuit 100 is located on a system-on-a-chip (SoC). The die 150 further includes the first load 140 and a second load 160, where the first load 140 operates at VDD and the second load 160 operates at VDDH. That is, the secondary power rail 146 is coupled to the second load 160 as well as the droop reduction circuit 100. An example of the second load 160 is a memory cell array, such as a cache memory implemented by static random-access memory (SRAM), or other volatile or non-volatile memory. A purpose of the second load 160 is to serve as an extra on-die capacitor for the droop reduction circuit 100, in addition to package and/or printed-circuit board (PCB) capacitors. The second load 160 and the droop reduction circuit 100 are on the same die. In one embodiment, the droop reduction circuit 100, the first load 145, and the second load 146 are all on the same die 150. The die 150 may be coupled to an off-die power supply such as a power management integrated circuit (PMIC) 180, which generates the supply voltage and the secondary voltage.

The die 150 may further include a clock circuit, RLC circuits, and other circuits not shown in FIG. 1A. These on-die circuits may operate at different voltages. The droop reduction circuit 100 operates by utilizing two different voltages supplied to the on-die circuits. One voltage is the supply voltage where a voltage droop may occur, and the other voltage is the secondary voltage higher than the supply voltage. There is no need for dedicating a power rail or a voltage for the purpose of operating the droop reduction circuit 100.

Figure 1B:
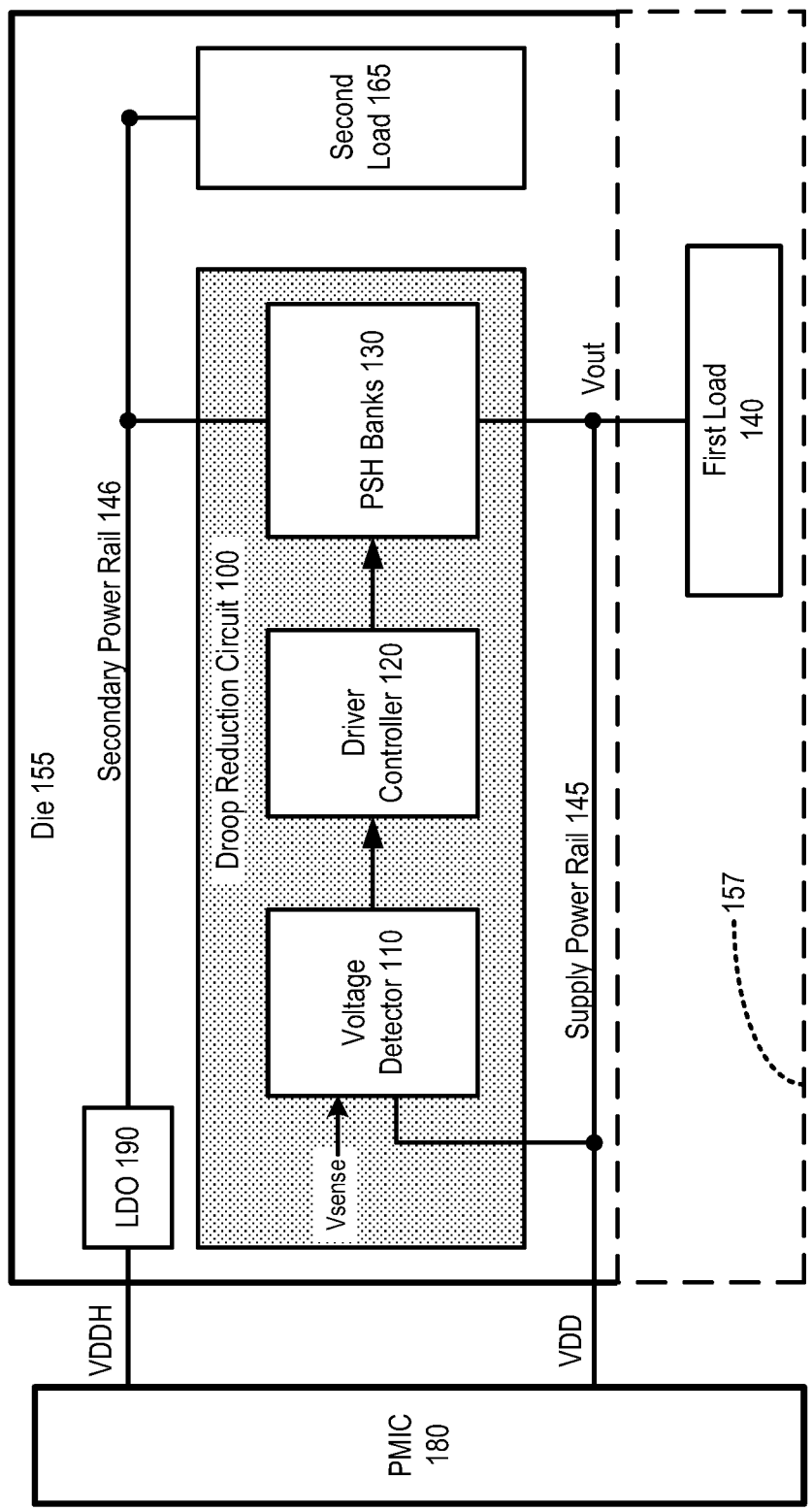
FIG. 1B illustrates a droop reduction circuit according to another embodiment.

FIG. 1B illustrates an alternative embodiment in which a die 155 includes the droop reduction circuit 100 of FIG. 1A. The die 155 further includes a low dropout (LDO) regulator 190 regulating the secondary voltage (i.e., VDDH) provided to the droop reduction circuit 100 and a second load 165. In one embodiment, the second load 165 may be any on-die integrated circuit. In an embodiment where the second load 165 is not a memory cell array, the secondary voltage may be provided to a memory cell array on another die. Similar to the embodiment of FIG. 1A, both the droop reduction circuit 100 and the second load 165 receive the secondary voltage for operation. There is no need for dedicating a power rail or a voltage for the purpose of operating the droop reduction circuit 100. Similar to the embodiment of FIG. 1A, the first load 140 may be located on the same die 155 and may operate at the same clock rate as the droop reduction circuit 100. Alternatively, the first load 140 may be located on a different die. In FIG. 1B, the location of the first load 140 is represented by a dotted block 157 to indicate that the first load 140 may be located on the die 155 or on another die.

In one embodiment, the droop reduction circuit 100 in FIG. 1A or 1B may be part of a device such as, but not limited to, a computing and/or communication device (e.g., a smartphone, a tablet, a laptop, a desktop, a server, an Internet-of-Things (IoT) device, a wearable device, an infotainment device, a gaming device, etc.).

Figure 2:
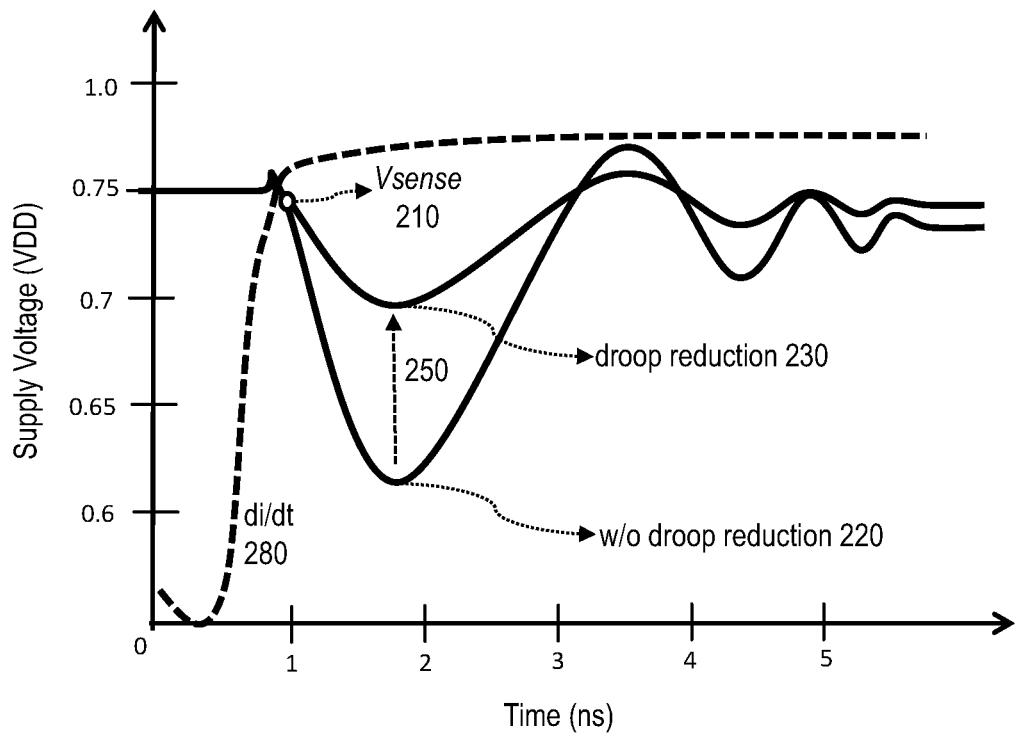
FIG. 2 is a diagram illustrating an example of voltage droop reduction according to one embodiment.

FIG. 2 is a diagram illustrating an example of voltage droop reduction according to one embodiment. The voltage droop reduction may be performed by the droop reduction circuit 100 in FIG. 1A or 1B. Voltage droop may occur when a processor core is turned on and the current drawn by the processor core sharply increases (i.e., current increases as shown by a dashed line 280). The reference voltage Vsense 210 in this example is configured to be 3% less than the nominal supply voltage at 0.75 V. When the droop reduction circuit 100 detects that the supply voltage is less than Vsense 210, it turns on the PSH banks 130 to pull up the supply voltage. Subsequently, the droop reduction circuit 100 may stagger turning off the PSH banks 130 to prevent voltage overshoot. In the example of FIG. 2, curve 220 shows the supply voltage without droop reduction and curve 230 shows the supply voltage with droop reduction. The dotted arrow 250 indicates the amount of reduction in the voltage droop.

Figure 3:
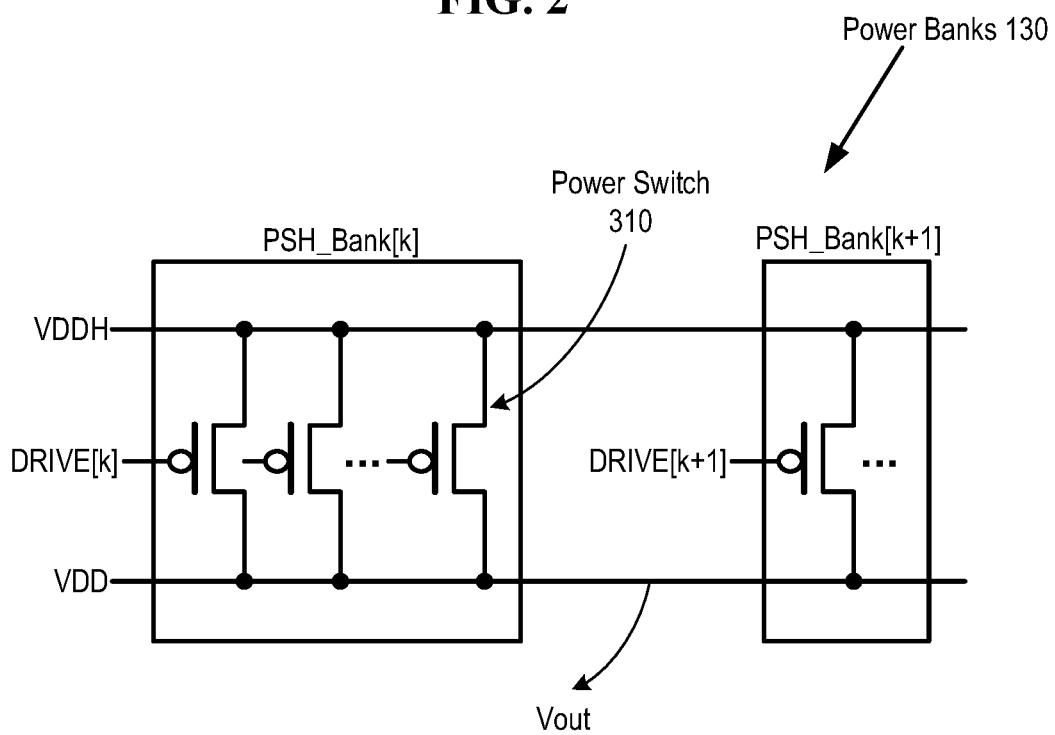
FIG. 3 is a schematic diagram illustrating a portion of power switch (PSH) banks in a droop reduction circuit according to one embodiment.

FIG. 3 is a schematic diagram illustrating a portion of the PSH banks 130 according to one embodiment. The PSH banks 130 includes multiple banks of power switches 310. The example of FIG. 3 shows PSH_bank[k] and PSH_bank [k+1] as part of the PSH banks 130. Each PSH bank includes one or more power switches 310, and different PSH banks may include different numbers of power switches 310. Each power switch 310 may be a metal oxide semiconductor field-effect transistor (MOSFET) switch; e.g., a P-channel MOSFET (P-MOSFET) switch, also referred to as a PMOS transistor switch. In one embodiment, each power switch 310 is a thin-oxide transistor, such as a thin-oxide MOSFET switch. Thin-oxide devices are more cost-effective than thick-oxide devices. In one embodiment, each power switch 310 is a thin-oxide P-channel MOSFET switch having a source terminal (also referred to as an input terminal) coupled to the secondary power rail 146 to receive the secondary voltage VDDH. As mentioned above, VDDH is less than 1 volt. This low voltage level (i.e., less than 1 volt) improves reliability and avoids overshoot issues in thin-oxide devices.

Each power switch 310 receives a corresponding drive signal (e.g., DRIVE[k] for PSH_bank[k]) via its gate terminal. The drive signal controls the on/off of the power switch 310. The power switch 310 further has a drain terminal (also referred to as an output terminal) coupled to the supply power rail 145. When the supply voltage on the supply power rail 145 is below Vsense, the power switch 310 is turned on and the output terminal outputs voltage Vout to pull up the voltage droop in the supply voltage. In one embodiment, all of the power switches 310 in each PSH bank are turned on or off together at the same time by the corresponding drive signal.

In one embodiment, the PSH banks 130 may include banks with different numbers of power switches to provide a number of granularities in voltage control. At least one PSH bank includes a different number of power switches from another PSH bank. For example, the PSH banks 130 may include eight power banks having 4, 4, 4, 4, 4, 4, 2, 1 power switches, respectively. For a fast response to voltage droop, the driver controller 120 may turn on all of the PSH banks 130 at once in parallel. For a slow response, the driver controller 120 may stagger the on or off of the PSH banks 130 by inserting a delay into the response time of each PSH bank 130.

Figure 4:
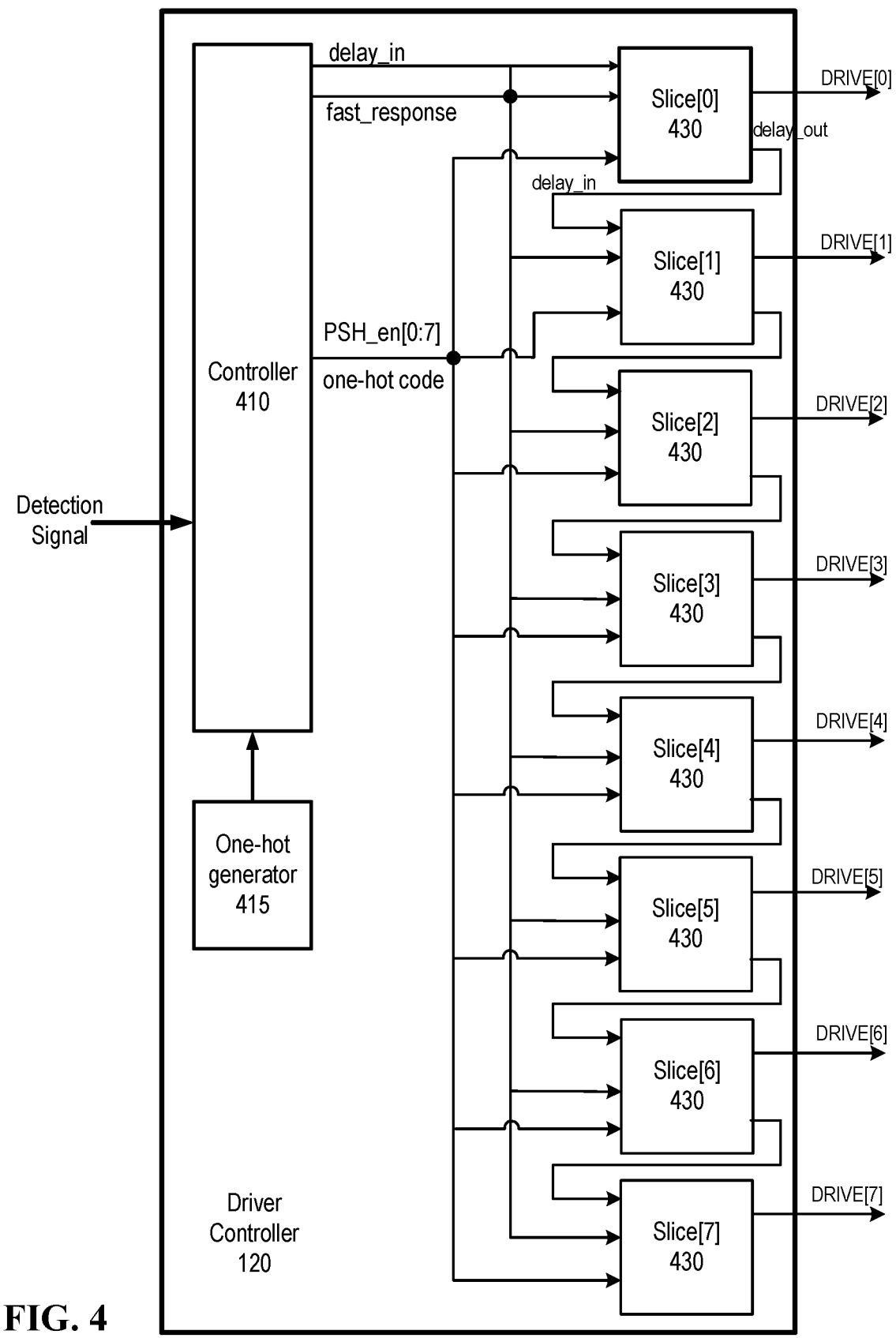
FIG. 4 is a schematic diagram illustrating a driver controller in a droop reduction circuit according to one embodiment.

FIG. 4 is a schematic diagram illustrating the driver controller 120 according to one embodiment. The driver controller 120 includes a controller 410 coupled to a set of slice circuits 430 (also referred to as slices 430). The number of slices 430 is equal to the number of banks in the PSH banks 130. Each slice 430 independently controls a corresponding PSH bank 130.

FIG. 4 shows an example of N slices where N=8. It is understood that the driver controller 120 may include any number of slices. In one embodiment, each slice 430 generates a drive signal (e.g., DRIVE[k]). The driver controller 120 generates N DRIVE signals to turn on/off the power switch(es) in the corresponding N PSH banks 130. Each slice 430 further generates a delay_out signal to control the delay time in generating its drive signal. The delay time controls the staggering of the N DRIVE signals.

In one embodiment, the driver controller 120 has two operating modes: a parallel mode and a sequential mode. In the parallel mode, the driver controller 120 provides a fast response by activating all of the slices 430 in parallel. In the sequential mode, the driver controller 120 provides a staggered response by activating the slices 430 sequentially, with a delay between every two consecutive slices 430. Each activated slice 430 outputs a DRIVE signal to turn on or off a corresponding PSH bank 130. In one embodiment, the value of the DRIVE signal may be determined by a corresponding PSH_en signal generated by the controller 410. For example, the controller 410 may assert PSH_en[k], which causes the assertion of DRIVE[k]. The assertion of DRIVE[k] causes the corresponding PSH_Bank[k] to be turned on.

The controller 410 may determine to operate in the parallel mode or the sequential model according to the detection signal from the voltage detector 110. In one embodiment, the detection signal may include a time series of sample values indicating the change and/or change rate in the supply voltage. In the parallel mode, the controller 410 generates a fast response signal to activate all of the slices 430 in parallel. Each slice 430 in the parallel mode can bypass delays or have the delay time set to a minimal value, such that each slice 430 can output its DRIVE signal as quickly as possible.

The controller 410 uses a one-hot generator 415 to generate a one-hot code to control the length of the delay time. The one-hot code includes a bit sequence. The bit sequence may be set to all zeros to bypass the delay; e.g., in the parallel mode operation. In the sequential mode, the bit sequence may include only one non-zero bit (i.e., only one "1" bit), and the rest of the bits are 0. The position of the "1" bit determines the delay time (Td) between consecutive slices 430 in the sequential mode. The one-hot code may be configurable; that is, the delay time may be configurable.

In the sequential mode, the driver controller 120 produces a slow response; that is, the DRIVE signals from the slices 430 are staggered. In one embodiment, the slices 430 form a slice chain where a delay_out signal from a previous slice, Slice[k−1], is fed into the next slice, Slice[k], as a delay_in signal. The reception of delay_in starts the delay time (Td) of Slice[k]. At the end of Td, Slice[k] outputs DRIVE[k] to PSH_Bank[k] and delay_out to Slice[k+1]. Thus, with a delay (Td) between two consecutive slices, the slices 430 sequentially (i.e., one slice at a time) send out DRIVE signals to their corresponding PSH banks 130.

In an embodiment, the driver controller 120 includes N slices (e.g., slice 430), where N is a positive integer. N is also the number of power banks. In response to voltage droop in the supply voltage, the N slices output N drive signals in parallel to turn on N power banks in parallel. Alternatively or additionally, the N slices output N drive signals sequentially with a delay (Td) between consecutive drive signals to stagger turning off N power banks. The N slices may be connected to each other via a parallel connection and a series connection. An input (e.g., fast_response) via the parallel connection to the N slices causes the N slices to output N drive signals in parallel. A delay input (e.g., delay_in) via the series connection to the N slices causes the N slices to output the N drive signals sequentially.

Figure 5:
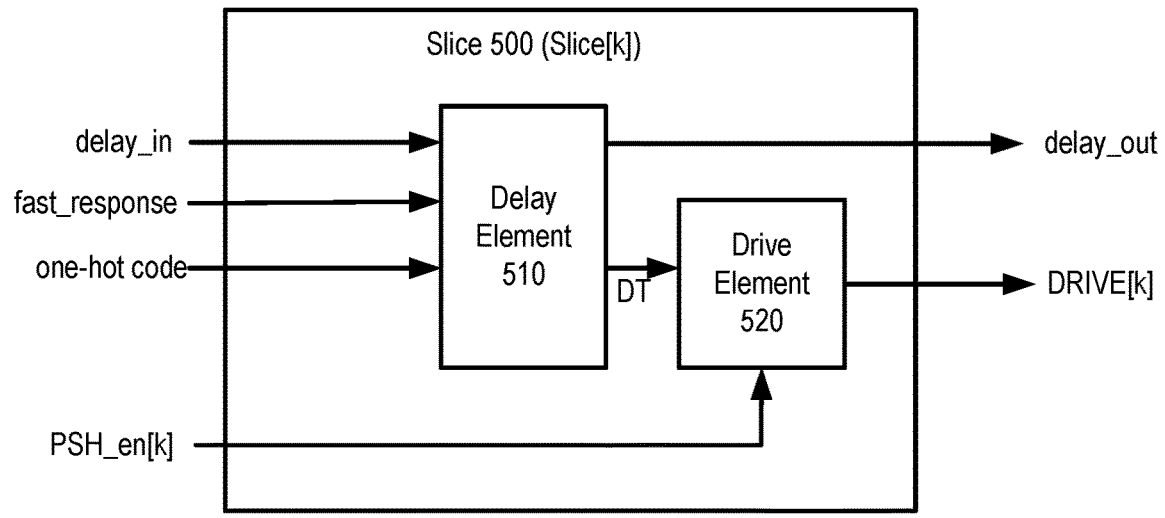
FIG. 5 is a schematic diagram illustrating a slice circuit in a driver controller according to one embodiment.

FIG. 5 is a schematic diagram illustrating a slice circuit 500 (also referred to as slice 500) according to one embodiment. The slice 500, shown as Slice[k], may be any of the slices 430 in FIG. 4. In one embodiment, each slice 500 includes a delay element 510 and a drive element 520. Each slice 500 uses the delay element 510 to control the delay time (Td) in generating a DRIVE signal, and uses the driver element 520 to generate the DRIVE signal.

When receiving an asserted fast_response signal (i.e., in the parallel mode), the delay element 510 generates a trigger signal DT with zero or minimal delay, and the trigger signal triggers the drive element 520 to output a DRIVE signal, DRIVE[k]. In one embodiment, DRIVE[k] has a binary value, where the value "1" may turn off a corresponding PSH bank and the value "0" may turn on the corresponding PSH bank, or vice versa. The value of DRIVE[k] may depend on the value of PSH en[k].

When receiving an asserted delay_in signal (i.e., in the sequential mode), the delay element 510 generates a trigger signal DT and delay_out with delay time (Td), where the value of Td is determined according to the one-hot code. The trigger signal DT triggers the drive element 520 to output DRIVE[k] to PSH_Bank[k], and also output delay_out to the next slice, Slice[k+1]. When Slice[k+1] receives delay_out at its input (as delay_in), Slice[k+1] delays Td before it generates DRIVE[k+1] and delay_out.

Figure 6:
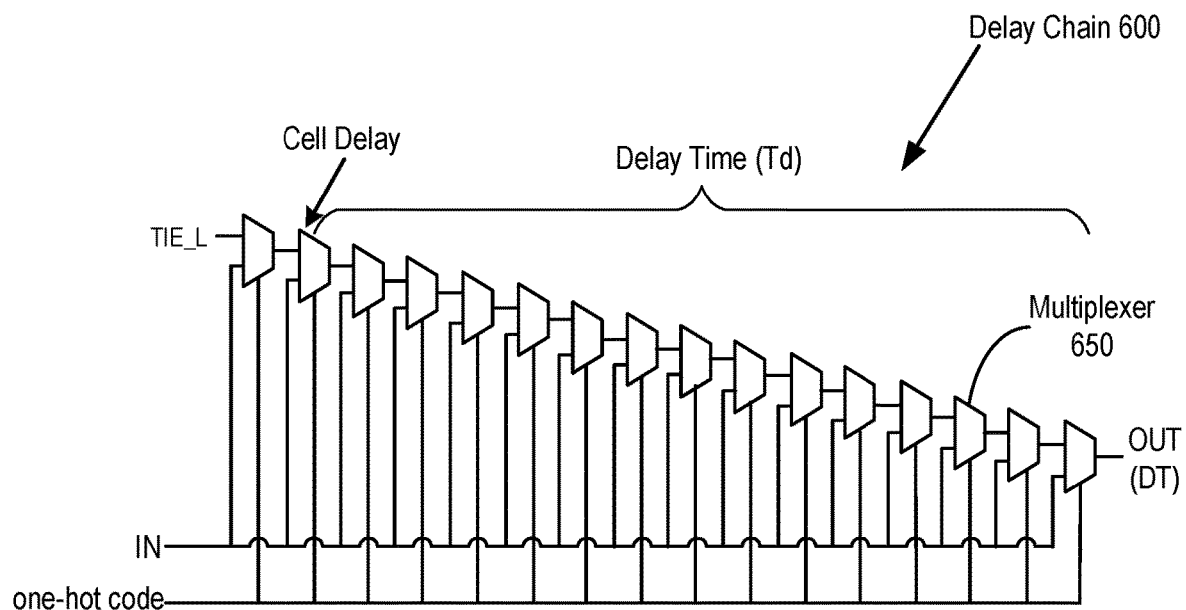
FIG. 6 is a schematic diagram illustrating a delay chain in a slice circuit according to one embodiment.

FIG. 6 is a schematic diagram illustrating a delay chain 600 formed by a chain of multiplexers 650 according to one embodiment. The delay chain 600 may be part of the delay element 510 in FIG. 5, which is part of the slice 500 or 430, which in turn is part of the driver controller 120 in FIGS. 1A, 1B, and 4. The delay chain 600 controls the delay time (Td) of each slice. Each multiplexer 650 adds a cell delay to the delay time. The delay time of the delay chain 600 is determined by the delay path length, which is, in turn, controlled by the one-hot signal. In one embodiment, a delay chain of M multiplexers provides a delay time length controlled by a configurable M-bit one-hot code containing at most one non-zero bit.

In the example of FIG. 6, the one-hot code contains 16 bits, with each bit corresponding to one multiplexer 650; e.g., the least-significant bit (LSB) of the one-hot code corresponding to the rightmost multiplexer as shown, and the most-significant bit (MSB) corresponding to the leftmost multiplexer as shown. The delay is bypassed when all of the bits in the one-hot code are zero. When the delay is not bypassed, the delay time is the shortest when the LSB of the one-hot code is 1, and the longest when the MSB of the one-hot code is 1. The "IN" and "TIE_L" values may be set to predetermined values. The output of the delay chain 600 is the trigger signal DT shown in FIG. 5.

Figure 7:
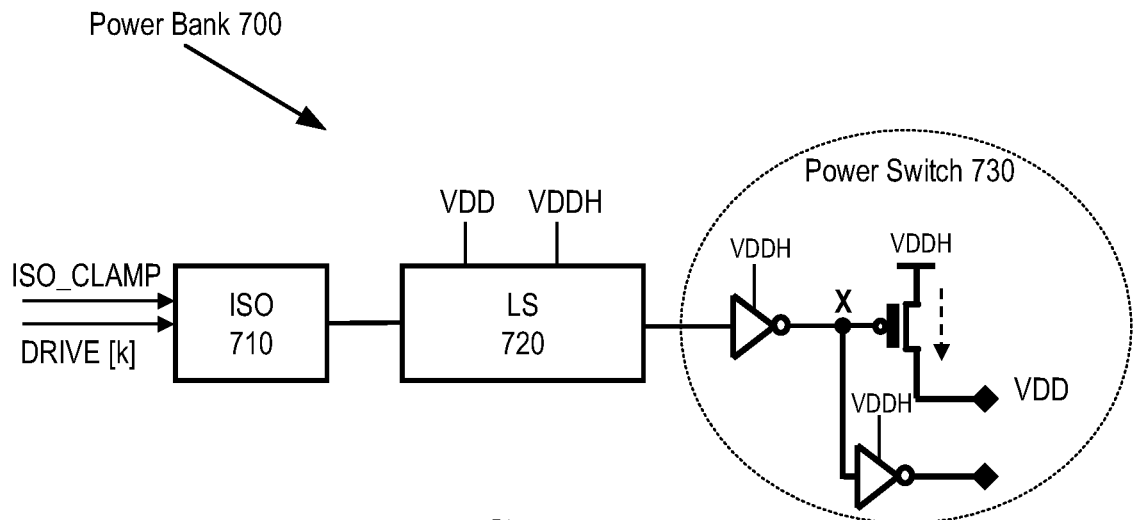
FIG. 7 is a diagram illustrating a PSH bank according to one embodiment.

FIG. 7 is a diagram illustrating a PSH bank 700 in the PSH banks 130 of FIG. 1 according to one embodiment. The number of PSH banks 700 is the same as the number of slices 430 in FIG. 4. In this example, the PSH bank 700 includes an isolation circuit (ISO) 710, a level shifter (LS) 720, and a power switch 730. For simplicity of illustration, the PSH bank 700 is shown to include only one power switch 730. However, it is understood that a PSH bank described herein may include any number of power switches 730 to provide a range of granularities for controlling the supply voltage.

As the driver controller 120 operates in the supply voltage (VDD) domain and the PSH banks 130 operate in the secondary voltage (VDDH) domain, the DRIVE signal sent from the driver controller 120 to the PSH bank 700 is first isolated by the isolation circuit 710 with an always-on ISO_clamp signal, and then shifted by the level shifter 720 to the VDDH domain. The voltage-shifted DRIVE signal is then used to turn on or off the power switch 730.

Figure 8:
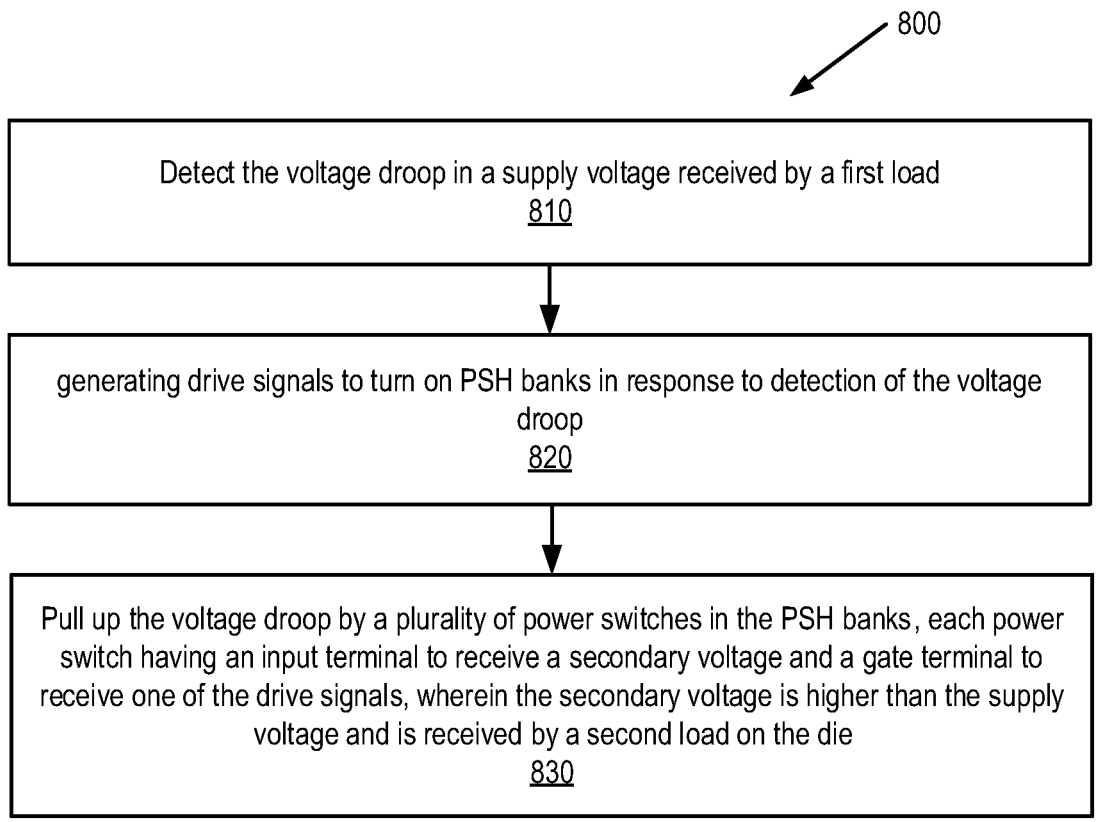
FIG. 8 is a flow diagram illustrating a method of a droop reduction circuit according to one embodiment.

FIG. 8 is a flow diagram illustrating a method 800 of a droop reduction circuit on a die according to one embodiment. The method 800 may be performed by the droop reduction circuit 100 in FIG. 1A or 1B. The method 800 begins at step 810 with the circuit detecting the voltage droop in a supply voltage received by a first load. At step 820, the circuit generates drive signals to turn on PSH banks in response to the detection of the voltage droop. At step 830, the circuit pulls up the voltage droop by a plurality of power switches in the PSH banks. Each power switch has an input terminal to receive a secondary voltage and a gate terminal to receive one of the drive signals. The secondary voltage is higher than the supply voltage and is received by a second load on the die.

The operations of the flow diagram of FIG. 8 have been described with reference to the exemplary embodiments of FIGS. 1A, 1B, and 3-7. However, it should be understood that the operations of the flow diagram of FIG. 8 can be performed by embodiments of the invention other than those discussed with reference to FIGS. 1A, 1B, and 3-7, and the embodiments discussed with reference to FIGS. 1A, 1B, and 3-7 can perform operations different than those discussed with reference to the flow diagram. While the flow diagram of FIG. 8 shows a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A droop reduction circuit on a die comprising:
   a voltage detector circuit to detect voltage droop in a supply voltage received by a first load;
   a driver controller circuit to drive power switch (PSH) banks in response to detection of the voltage droop; and
   the PSH banks, each of which includes at least one power switch having an input terminal to receive a secondary voltage which is higher than the supply voltage and is received by a second load on the die, a gate terminal to receive a drive signal from the driver controller, and an output terminal to pull up the voltage droop in the supply voltage, wherein the driver controller circuit includes N slice circuits connected to each other via a parallel connection and a series connection, wherein an input via the parallel connection to the N slice circuits causes the N slice circuits to output N drive signals in parallel, and a delay input via the series connection to the N slice circuits causes the N slice circuits to output the N drive signals sequentially, N being the number of the PSH banks.

2. A droop reduction circuit on a die comprising:
   a voltage detector circuit to detect voltage droop in a supply voltage received by a first load;
   a driver controller circuit to drive power switch (PSH) banks in response to detection of the voltage droop; and
   the PSH banks, each of which includes at least one power switch having an input terminal to receive a secondary voltage which is higher than the supply voltage and is received by a second load on the die, a gate terminal to receive a drive signal from the driver controller, and an output terminal to pull up the voltage droop in the supply voltage, wherein the driver controller circuit includes a delay chain of M multiplexers which provides a delay time length controlled by a configurable M-bit one-hot code containing at most one non-zero bit.

3. The droop reduction circuit of claim 2, wherein the driver controller circuit operates in a supply voltage domain and power switches in the PSH banks operate in a secondary voltage domain.

4. The droop reduction circuit of claim 2, wherein the supply power rail is further coupled to a first load comprising a processing circuit, and the secondary power rail is further coupled to a second load comprising a memory cell array.

5. The droop reduction circuit of claim 2, wherein the secondary voltage is supplied by a low-dropout (LDO) voltage regulator on the die.

6. The droop reduction circuit of claim 2, wherein the secondary voltage is less than 1 volt.

7. The droop reduction circuit of claim 2, wherein each PSH bank includes one or more thin-oxide metal oxide semiconductor field-effect transistor (MOSFET) switches.

8. The droop reduction circuit of claim 2, wherein each PSH bank includes one or more power switches, and at least one PSH bank includes a different number of power switches from another PSH bank.

9. The droop reduction circuit of claim 2, wherein the driver controller circuit outputs drive signals to turn on or off of the PSH banks independently of one another.

10. The droop reduction circuit of claim 2, wherein, in response to the voltage droop, the driver controller circuit is operative to output N drive signals in parallel to turn on N PSH banks in parallel.

11. The droop reduction circuit of claim 2, wherein the driver controller circuit is operative to output N drive signals sequentially with a delay between consecutive ones of the drive signals to stagger turning off N PSH banks.

12. A method of a droop reduction circuit on a die, comprising:
   detecting voltage droop in a supply voltage received by a first load;
   generating drive signals to turn on power switch (PSH) banks in response to detection of the voltage droop; and
   pulling up the voltage droop by a plurality of power switches in the PSH banks, each power switch having an input terminal to receive a secondary voltage and a gate terminal to receive one of the drive signals, wherein the secondary voltage is higher than the supply voltage and is received by a second load on the die;
   generating N drive signals sequentially with a delay between consecutive ones of the drive signals to stagger turning off N PSH banks; and
   setting a length of the delay with a delay chain of M multiplexers controlled by a configurable M-bit one-hot code containing at most one non-zero bit.

13. The method of claim 12, wherein the supply power rail is further coupled to the first load comprising a processing circuit, the secondary power rail is further coupled to the second load comprising a memory cell array.

14. The method of claim 12, further comprising:
   supplying the secondary voltage to the second load by a low-dropout (LDO) voltage regulator on the die.

15. The method of claim 12, wherein each PSH bank includes one or more thin-oxide metal oxide semiconductor field-effect transistor (MOSFET) switches.

16. The method of claim 12, further comprising:
   generating the drive signals to turn on or off of the PSH banks independently of one another.

17. The method of claim 12, further comprising:
   in response to the voltage droop, generating N drive signals in parallel to turn on N PSH banks in parallel.

* * * * *